United States Patent
Chen (10) Patent No.: US 9,041,068 B2
(45) Date of Patent: May 26, 2015

(54) 3D SEMICONDUCTOR DEVICE AND 3D LOGIC ARRAY STRUCTURE THEREOF

(71) Applicant: MACRONIX INTERNATIONAL CO., LTD., Hsinchu (TW)

(72) Inventor: Shih-Hung Chen, HsinChu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 1 day.

(21) Appl. No.: 14/042,776

(22) Filed: Oct. 1, 2013

(65) Prior Publication Data

US 2015/0091064 A1    Apr. 2, 2015

(51) Int. Cl.
*H01L 27/118* (2006.01)
(52) U.S. Cl.
CPC ............................. *H01L 27/11803* (2013.01)
(58) Field of Classification Search
USPC ........................... 257/204.202, 390, E27.108
See application file for complete search history.

(56) References Cited

U.S. PATENT DOCUMENTS

| 8,363,476 B2 | 1/2013 | Lue | |
| 2012/0068254 A1* | 3/2012 | Sakuma et al. | 257/324 |

FOREIGN PATENT DOCUMENTS

| TW | 201232554 | 8/2012 |
| TW | 201246511 | 11/2012 |

OTHER PUBLICATIONS

U.S. Appl. No. 13/443,496, filed Apr. 10, 2012.
U.S. Appl. No. 13/009,464, filed Jan. 19, 2011.
English Abstract translation of TW201232554 (Published Aug. 1, 2012).
English Abstract translation of TW201246511 (Published Nov. 16, 2012).

* cited by examiner

*Primary Examiner* — Timor Karimy
(74) *Attorney, Agent, or Firm* — McClure, Qualey & Rodack, LLP (57) ABSTRACT

A 3D semiconductor device and a 3D logic array structure thereof are provided. The 3D semiconductor device includes an array structure, a periphery line structure and a 3D logic array structure. The array structure has Y contacts located at a side of the array structure. Y is within $M^{N-1}$ to $M^N$. Y, M and N are natural numbers. M is larger or equal to 2. The 3D logic array structure includes N sets of gate electrodes, an input electrode and Y output electrodes. Each set of the gate electrodes has M gate electrodes. The Y output electrodes connect the Y contacts. The M·N gate electrodes and the input electrode connect the periphery line structure.

7 Claims, 7 Drawing Sheets

3D SEMICONDUCTOR DEVICE AND 3D LOGIC ARRAY STRUCTURE THEREOF

BACKGROUND

1. Technical Field

The disclosure relates in general to a semiconductor device and a logic array structure thereof, and more particularly to a 3D semiconductor device and a 3D logic array structure thereof.

2. Description of the Related Art

In the manufacturing of high density memory devices, the amount of data per unit area on an integrated circuit can be a critical factor. Thus, as the critical dimensions of the memory devices approach technology limits, techniques for stacking multiple levels of memory cells have been proposed in order to achieve greater storage density and lower costs per bit. Also, new memory technologies are being deployed, including phase change memory, ferromagnetic memory, metal oxide based memory and so on.

The memory technologies being deployed can require a different sequence of manufacturing steps, than do the supporting peripheral circuits such as the logic for address decoders, state machines, and command decoders. As a result of the need to support the manufacturing steps for both the memory array and the peripheral circuits, the manufacturing lines needed to implement memory devices can be more expensive, or compromises are made in the type of circuitry implemented in the peripheral circuits. This leads to higher costs for integrated circuits made using more advanced technologies.

As costs for manufacturing higher and higher memory capacity in integrated circuit memory devices continues to increase, it is desirable to provide an integrated circuit memory structure having a lower manufacturing costs.

SUMMARY

The disclosure is directed to a 3D semiconductor device and a 3D logic array structure thereof. The 3D logic array structure disposed between an array structure and a periphery line structure is provided for reducing the manufacturing cost.

According to a first aspect of the present disclosure, a 3D semiconductor device is provided. The 3D semiconductor device includes an array structure, a periphery line structure and a 3D logic array structure. The array structure has Y contacts located at a side of the array structure. Y is within $M^{N-1}$ to $M^N$. Y, M and N are natural numbers. M is larger or equal to 2. The 3D logic array structure includes N sets of gate electrodes, an input electrode and Y output electrodes. Each set of the gate electrodes has M gate electrodes. The Y output electrodes connect the Y contacts. The M·N gate electrodes and the input electrode connect the periphery line structure.

According to a second aspect of the present disclosure, a 3D logic array structure is provided. The 3D logic array structure includes N sets of gate electrodes, an input electrode and Y output electrodes. Each set of the gate electrodes has M gate electrodes. The Y output electrodes connect Y contacts of an array structure. The N contacts are located at a side of the array structure. The M·N gate electrodes and the input electrode connect a periphery line structure. Y is within $M^{N-1}$ to $M^N$. Y, M and N are natural numbers. M is larger or equal to 2.

According to a second aspect of the present disclosure, a 3D logic array structure is provided. The 3D logic array structure includes M first gate electrodes, a plurality of first gates, N second gate electrodes, a plurality of second gates and Y semiconductor stacks. Each first gate electrode being applied a positive voltage, a negative voltage or a ground voltage. Each first gate is connected to one of the first gate electrodes in turn. Each second gate electrode is applied the positive voltage, the negative voltage or the ground voltage. Each second gate is connected to one of the second gate electrodes in turn. Each semiconductor stack is located between two of the first gates and two of the second gates. The number of the first gates is equal to that of the second gates. The number of the first gates is equal to or smaller than M*N+1. Y is equal to or smaller than M*N. M and N are natural numbers. M and N are larger or equal to 4. The greatest common divisor of M and N is 1.

The above and other aspects of the disclosure will become better understood with regard to the following detailed description of the non-limiting embodiment(s). The following description is made with reference to the accompanying drawings.

DETAILED DESCRIPTION

Preferred embodiments are disclosed below for elaborating the invention. A 3D logic array structure disposed between an array structure and a periphery line structure is provided for reducing the manufacturing cost. The following embodiments are for the purpose of elaboration only, not for limiting the scope of protection of the invention. Besides, secondary elements are omitted in the following embodiments to highlight the technical features of the invention.

Figure 1:
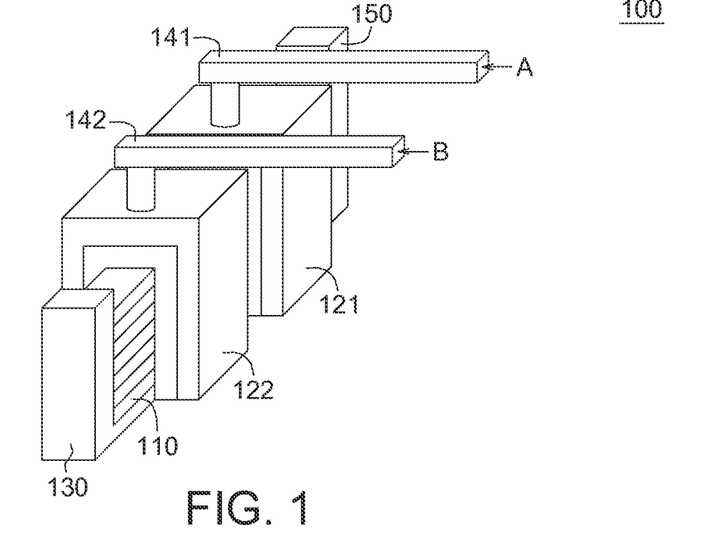
FIG. 1 shows a 3D logic array structure.

Please referring to FIG. 1, a 3D logic array structure 100 is shown. The 3D logic array structure 100 includes one semiconductor stack 110, two gates 121, 122, one input electrode 130, two gate electrodes 141, 142 and one output electrode 150. The gates 121, 122 are disposed above the semiconductor stack 110. Each of the gates 121, 122 connects to one of the gate electrodes 141, 142. The input electrode 130 and the output electrode 150 are disposed at two opposite ends of the semiconductor stack 110.

While the gates 121, 122 are applied a suitable voltage through the gate electrodes 141, 142 respectively, a channel will be formed in the semiconductor stack 110, and the input electrode 130 and the output electrode 150 will be electrically connected.

For example, please refer to a table I, shown as below. A logic value A represents whether the gate electrode 141 is applied the suitable voltage or not. If the logic value A is "0", then the gate electrode 141 is not applied the suitable voltage; if the logic value A is "1", then the gate electrode 141 is applied the suitable voltage. Similarly, a logic value B represents whether the gate electrode 142 is applied the suitable voltage or not. If the logic value B is "0", then the gate electrode 142 is not applied the suitable voltage; if the logic value B is "1", then the gate electrode 142 is applied the suitable voltage.

When both of the gate electrode 141 and the gate electrode 142 are applied the suitable voltage, i.e. the logic values A and B are both "1", then the output electrode 150 can get the value "V" which is inputted from the input electrode 130.

TABLE I

| Input electrode 130 | Logic value A | Logic value B | Output electrode 150 |
|---|---|---|---|
| V | 0 | 0 | 0 |
| V | 0 | 1 | 0 |
| V | 1 | 0 | 0 |
| V | 1 | 1 | V |

Figure 2:
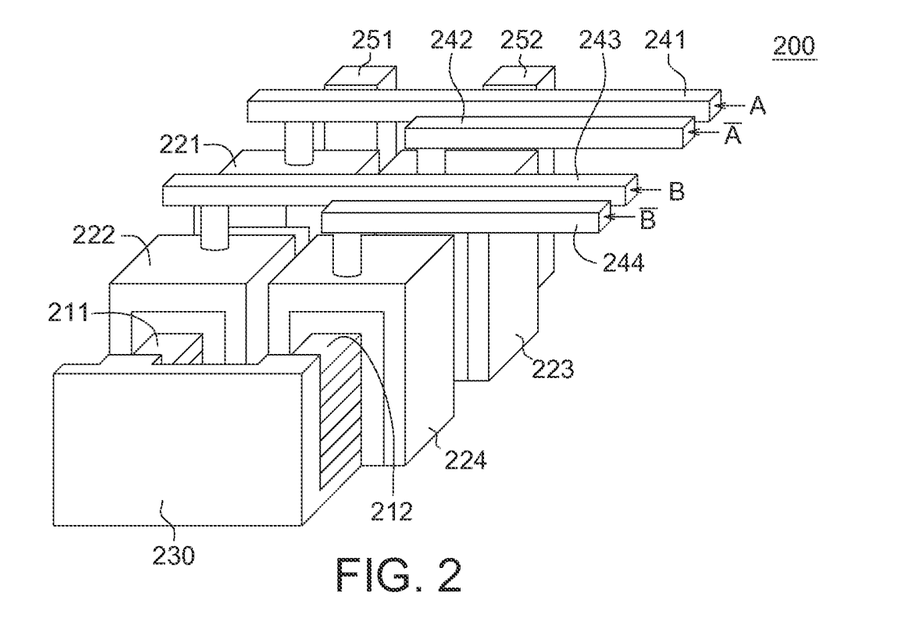
FIG. 2 shows another 3D logic array structure.

Please referring to FIG. 2, another 3D logic array structure 200 is shown. The 3D logic array structure 200 includes two semiconductor stacks 211, 212, four gates 221, 222, 223, 224, one input electrode 230, four gate electrodes 241, 242, 243, 244 and two output electrodes 251, 252. Two of the gates 221, 222, 223, 224 are disposed above one of the semiconductor stacks 211, 212. Each of the gates 221, 222, 223, 224 connects to one of the gate electrodes 241, 242, 243, 244. The input electrode 230 and one of the output electrodes 251, 252 are disposed at two opposite ends of one of the semiconductor stacks 211, 212.

While the gates 221, 222 are applied a suitable voltage through the gate electrodes 241, 242 respectively, a channel will be formed in the semiconductor stack 211, and the input electrode 230 and the output electrode 251 are electrically connected. While the gates 223, 224 are applied a suitable voltage through the gate electrodes 243, 244 respectively, another channel will be formed in the semiconductor stack 212, and the input electrode 230 and the output electrode 252 are electrically connected.

For example, please refer to a table II, shown as below. The logic value A represents whether the gate electrode 241 is applied the suitable voltage or not. If the logic value A is "0", then the gate electrode 241 is not applied the suitable voltage; if the logic value A is "1", then the gate electrode 241 is applied the suitable voltage. Similarly, the logic value B represents whether the gate electrode 243 is applied the suitable voltage or not. If the logic value B is "0", then the gate electrode 243 is not applied the suitable voltage; if the logic value B is "1", then the gate electrode 243 is applied the suitable voltage.

Further, a logic value $\overline{A}$ which is the revise of the logic value A represents whether the gate electrode 242 is applied the suitable voltage or not. If the logic value A is "0", then the logic value $\overline{A}$ is "1" and the gate electrode 242 is applied the suitable voltage; if the logic value A is "1", then the logic value $\overline{A}$ is "0" and the gate electrode 242 is not applied the suitable voltage. Similarly, a logic value $\overline{B}$ which is the revise of the logic value B represents whether the gate electrode 244 is applied the suitable voltage or not. If the logic value B is "0", then the logic value $\overline{B}$ is "1" and the gate electrode 244 is applied the suitable voltage; if the logic value B is "1", then the logic value $\overline{B}$ is "0" and the gate electrode 244 is not applied the suitable voltage.

When both of the gate electrode 241 and the gate electrode 243 are applied the suitable voltage, i.e. the logic values A and B are both "1", then the output electrode 251 can get the value "V" which is inputted from the input electrode 230. Similarly, when both of the gate electrode 242 and the gate electrode 244 are applied the suitable voltage, i.e. the logic values A and B are both "0", then the output electrode 252 can get the value "V" which is inputted from the input electrode 230.

TABLE II

| Input electrode 230 | Logic value A | Logic value B | Output electrode 251 | Output electrode 252 |
|---|---|---|---|---|
| V | 0 | 0 | 0 | V |
| V | 0 | 1 | 0 | 0 |
| V | 1 | 0 | 0 | 0 |
| V | 1 | 1 | V | 0 |

Figure 3:
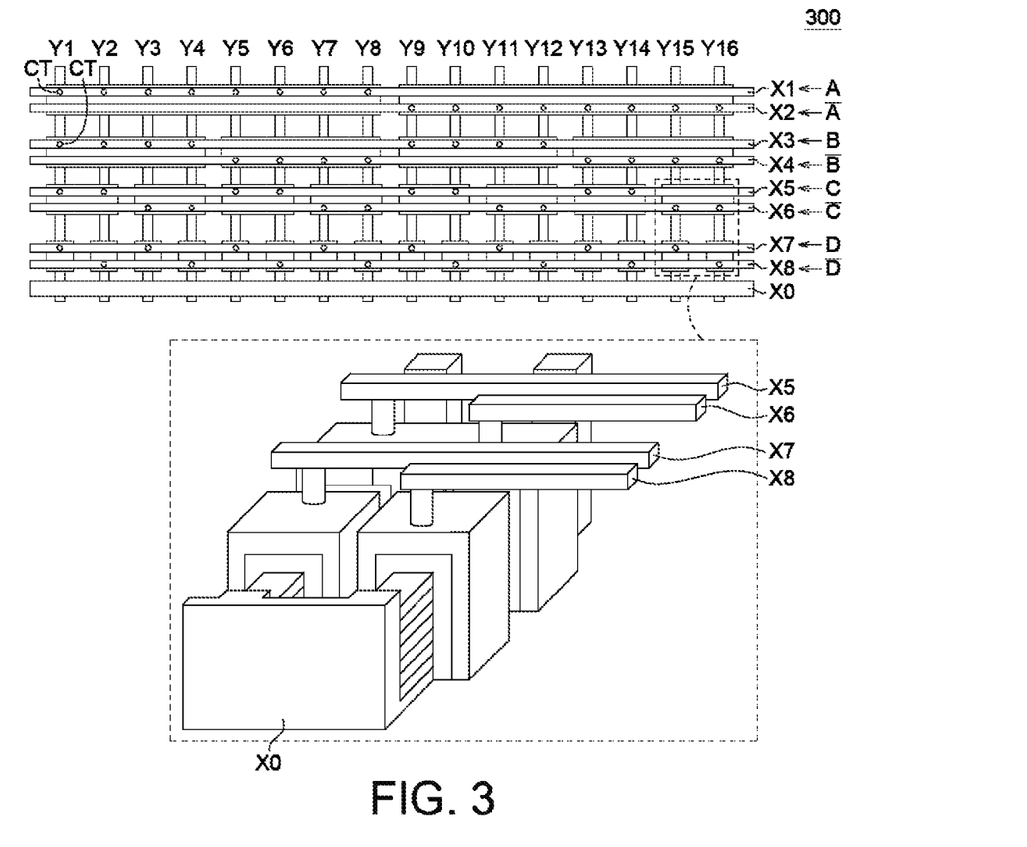
FIG. 3 shows another 3D logic array structure.

Please referring to FIG. 3, another 3D logic array structure 300 is shown. The 3D logic array structure 300 includes one input electrode X0, 8 gate electrodes X1 to X8 and 16 output electrodes Y1 to Y16.

Please refer to a table III, shown as below. The logic value A represents whether the gate electrode X1 is applied the suitable voltage or not. If the logic value A is "0", then the gate electrode X1 is not applied the suitable voltage; if the logic value A is "1", then the gate electrode X1 is applied the suitable voltage. Similarly, logic values B, C and D respectively represent whether the gate electrodes X3, X5 and X7 are applied the suitable voltage or not. If the logic value B is "0", then the gate electrode X3 is not applied the suitable voltage; if the logic value B is "1", then the gate electrode X3 is applied the suitable voltage.

Further, the logic value $\overline{A}$ which is the revise of the logic value A represents whether the gate electrode X2 is applied the suitable voltage or not. If the logic value A is "0", then the logic value $\overline{A}$ is "1" and the gate electrode X2 is applied the suitable voltage; if the logic value A is "1", then the logic value $\overline{A}$ is "0" and the gate electrode X2 is not applied the suitable voltage. Similarly, the logic value $\overline{B}$, $\overline{C}$ and $\overline{D}$ which are the revise of the logic values B, C and D respectively represent whether the gate electrodes X4, X6 and X8 are applied the suitable voltage or not. If the logic value B is "0", then the logic value $\overline{B}$ is "1" and the gate electrode X4 is applied the suitable voltage; if the logic value B is "1", then the logic value $\overline{B}$ is "0" and the gate electrode X4 is not applied the suitable voltage.

For each output electrode Y1 to Y16, there are four contacts CT electrically connected to four of the gate electrodes X1 to X8. For example, for the output electrode Y1, there are four contacts CT electrically connected to the gate electrodes X1, X3, X5, X7. For the output electrode Y2, there are four contacts CT electrically connected to the gate electrodes X1, X3, X5, X8. There are 16 kinds of selections for selecting four of the 8 gate electrodes X1 to X8. The selection of the gate electrodes X1 to X8 electrically connected to each of the output electrodes Y1 to Y16 via four contacts CT is different from others.

When all of the gate electrodes X1, X3, X5, X7 are applied the suitable voltage, i.e. the logic values A, B, C, D are "1", then the output electrode Y1 can get the value "V" which is inputted from the input electrode X0. Similarly, when all of the gate electrode X1, X3, X5, X8 are applied the suitable voltage, i.e. the logic values A, B, C are "1" and the logic value D is "0", then the output electrode Y2 can get the value "V" which is inputted from the input electrode X0.

TABLE III

| X0 | A | B | C | D | Y1 | Y2 | Y3 | Y4 | Y5 | Y6 | Y7 | Y8 | Y9 | Y10 | Y11 | Y12 | Y13 | Y14 | Y15 | Y16 |
|---|---|---|---|---|---|---|---|---|---|---|---|---|---|---|---|---|---|---|---|---|
| V | 1 | 1 | 1 | 1 | V | 0 | 0 | 0 | 0 | 0 | 0 | 0 | 0 | 0 | 0 | 0 | 0 | 0 | 0 | 0 |
| V | 1 | 1 | 1 | 0 | 0 | V | 0 | 0 | 0 | 0 | 0 | 0 | 0 | 0 | 0 | 0 | 0 | 0 | 0 | 0 |
| V | 1 | 1 | 0 | 1 | 0 | 0 | V | 0 | 0 | 0 | 0 | 0 | 0 | 0 | 0 | 0 | 0 | 0 | 0 | 0 |
| V | 1 | 1 | 0 | 0 | 0 | 0 | 0 | V | 0 | 0 | 0 | 0 | 0 | 0 | 0 | 0 | 0 | 0 | 0 | 0 |
| V | 1 | 0 | 1 | 1 | 0 | 0 | 0 | 0 | V | 0 | 0 | 0 | 0 | 0 | 0 | 0 | 0 | 0 | 0 | 0 |
| V | 1 | 0 | 1 | 0 | 0 | 0 | 0 | 0 | 0 | V | 0 | 0 | 0 | 0 | 0 | 0 | 0 | 0 | 0 | 0 |
| V | 1 | 0 | 0 | 1 | 0 | 0 | 0 | 0 | 0 | 0 | V | 0 | 0 | 0 | 0 | 0 | 0 | 0 | 0 | 0 |
| V | 1 | 0 | 0 | 0 | 0 | 0 | 0 | 0 | 0 | 0 | 0 | V | 0 | 0 | 0 | 0 | 0 | 0 | 0 | 0 |
| V | 0 | 1 | 1 | 1 | 0 | 0 | 0 | 0 | 0 | 0 | 0 | 0 | V | 0 | 0 | 0 | 0 | 0 | 0 | 0 |
| V | 0 | 1 | 1 | 0 | 0 | 0 | 0 | 0 | 0 | 0 | 0 | 0 | 0 | V | 0 | 0 | 0 | 0 | 0 | 0 |
| V | 0 | 1 | 0 | 1 | 0 | 0 | 0 | 0 | 0 | 0 | 0 | 0 | 0 | 0 | V | 0 | 0 | 0 | 0 | 0 |
| V | 0 | 1 | 0 | 0 | 0 | 0 | 0 | 0 | 0 | 0 | 0 | 0 | 0 | 0 | 0 | V | 0 | 0 | 0 | 0 |
| V | 0 | 0 | 1 | 1 | 0 | 0 | 0 | 0 | 0 | 0 | 0 | 0 | 0 | 0 | 0 | 0 | V | 0 | 0 | 0 |
| V | 0 | 0 | 1 | 0 | 0 | 0 | 0 | 0 | 0 | 0 | 0 | 0 | 0 | 0 | 0 | 0 | 0 | V | 0 | 0 |
| V | 0 | 0 | 0 | 1 | 0 | 0 | 0 | 0 | 0 | 0 | 0 | 0 | 0 | 0 | 0 | 0 | 0 | 0 | V | 0 |
| V | 0 | 0 | 0 | 0 | 0 | 0 | 0 | 0 | 0 | 0 | 0 | 0 | 0 | 0 | 0 | 0 | 0 | 0 | 0 | V |

In FIG. 3, four sets of logic values A and $\overline{A}$; B and $\overline{B}$, C and $\overline{C}$; D and $\overline{D}$ corresponding 8 gate electrodes X1 to X8 and one input electrode X0 can be used for 16 output electrodes Y1 to Y16. Therefore, 9 input signals can result 16 output signals. Similarly, to get $2^{N-1}$ to $2^N$ output signals, it is just needed 2N+1 input signals. N is a natural number. The 2N+1 input signals are corresponding N sets of gate electrodes and one input electrode. Each set of the gate electrodes includes two gate electrodes.

In FIG. 3, each set of logic value has two levels, such as "0" and "1." In one embodiment, each set of logical value can have M levels, such as "0", "1", . . . , "M−1". The logic values of M of each set of the gate electrodes are exclusive. M is an integer which is larger than two. Therefore, to get $M^{N-1}$ to $M^N$ output signals, it is just needed M·N+1 input signals. N and M are natural numbers. The M·N+1 input signals are corresponding N sets of gate electrodes and one input electrode. Each set of the gate electrodes includes M gate electrodes.

Figure 4:
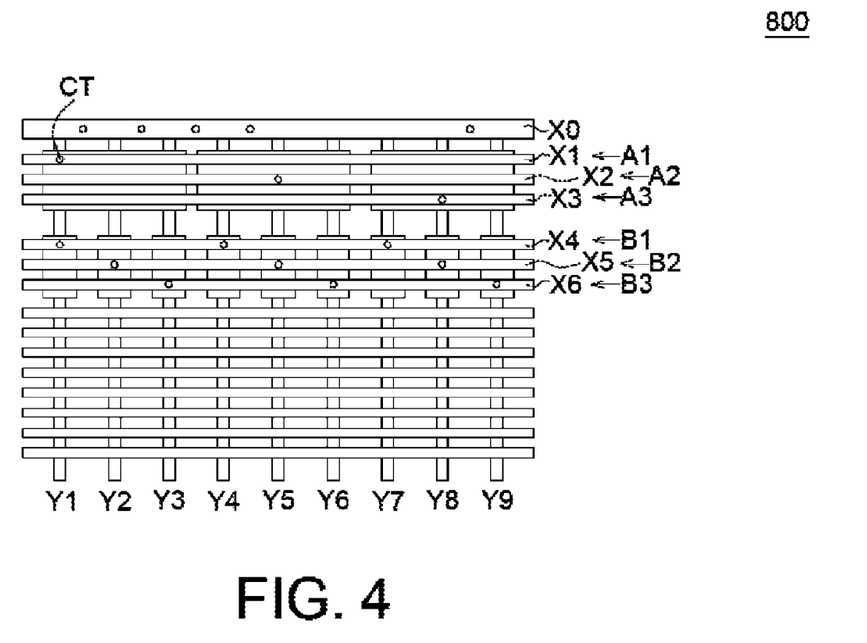
FIG. 4 shows another 3D logic array structure.

For each output electrode Y1 to Y9, there are two contacts CT electrically connected to one of the gate electrodes X1 to X3 and one of the gate electrodes X4 to X6. For example, for the output electrode Y1, there are two contacts CT electrically connected to the gate electrodes X1 and X4. For the output electrode Y2, there are two contacts CT electrically connected to the gate electrodes X1 and X5. There are 9 kinds of selections for selecting one of the 3 gate electrodes X1 to X3 and one of the 3 gate electrodes X4 to X6.

When the gate electrodes X1 and X4 are applied the suitable voltage, i.e. the logic values A1 and B1 are "1", then the output electrode Y1 can get the value "V" which is inputted from the input electrode X0. Similarly, when the gate electrode X1 and X5 are applied the suitable voltage, i.e. the logic values A1 and B2 are "1", then the output electrode Y2 can get the value "V" which is inputted from the input electrode X0.

TABLE IV

| X0 | A1 | A2 | A3 | B1 | B2 | B3 | Y1 | Y2 | Y3 | Y4 | Y5 | Y6 | Y7 | Y8 | Y9 |
|---|---|---|---|---|---|---|---|---|---|---|---|---|---|---|---|
| V | 1 | 0 | 0 | 1 | 0 | 0 | V | 0 | 0 | 0 | 0 | 0 | 0 | 0 | 0 |
| V | 1 | 0 | 0 | 0 | 1 | 0 | 0 | V | 0 | 0 | 0 | 0 | 0 | 0 | 0 |
| V | 1 | 0 | 0 | 0 | 0 | 1 | 0 | 0 | V | 0 | 0 | 0 | 0 | 0 | 0 |
| V | 0 | 1 | 0 | 1 | 0 | 0 | 0 | 0 | 0 | V | 0 | 0 | 0 | 0 | 0 |
| V | 0 | 1 | 0 | 0 | 1 | 0 | 0 | 0 | 0 | 0 | V | 0 | 0 | 0 | 0 |
| V | 0 | 1 | 0 | 0 | 0 | 1 | 0 | 0 | 0 | 0 | 0 | V | 0 | 0 | 0 |
| V | 0 | 0 | 1 | 1 | 0 | 0 | 0 | 0 | 0 | 0 | 0 | 0 | V | 0 | 0 |
| V | 0 | 0 | 1 | 0 | 1 | 0 | 0 | 0 | 0 | 0 | 0 | 0 | 0 | V | 0 |
| V | 0 | 0 | 1 | 0 | 0 | 1 | 0 | 0 | 0 | 0 | 0 | 0 | 0 | 0 | V |

Please referring to FIG. 4, another 3D logic array structure 800 is shown. The 3D logic array structure 800 includes one input electrode X0, 6 gate electrodes X1 to X6 and 9 output electrodes Y1 to Y9.

Please refer to a table IV, shown as below. The logic value A1 represents whether the gate electrode X1 is applied the suitable voltage or not. If the logic value A1 is "0", then the gate electrode X1 is not applied the suitable voltage; if the logic value A1 is "1", then the gate electrode X1 is applied the suitable voltage. Similarly, logic values A2, A3, B1, B2 and B3 respectively represent whether the gate electrodes X2, X3, X4, X5 and X6 are applied the suitable voltage or not. For the logic values A1, A2 and A3, only one of the logic values A1, A2 and A3 is "1", and the others are "0." For the logic values B1, B2 and B3, only one of the logic values B1, B2 and B3 is "1", and the others are "0."

In FIG. 4, two sets of logic values A1, A2, A3; B1, B2, B3 corresponding 6 gate electrodes X1 to X6 and one input electrode X0 can be used for 9 output electrodes Y1 to Y9. Therefore, 7 input signals can result 9 output signals. Similarly, to get $3^{N-1}$ to $3^N$ output signals, it is just needed 3N+1 input signals. N is a natural number. The 3N+1 input signals are corresponding N sets of gate electrodes and one input electrode. Each set of the gate electrodes includes 3 gate electrodes.

Please refer to a table V, shown as below. 3 sets of logic values A1, A2, A3; B1, B2, B3; and C1, C2, C3 corresponding 9 gate electrodes and one input electrode X0 can be used for 27 output electrodes. To get 27 output signals, it is just needed 3·3+1 input signals.

TABLE V

| X0 | A1, A2, A3 | B1, B2, B3 | C1, C2, C3 | Y1 | Y2 | Y3 | Y4 | Y5 | ... | Y25 | Y26 | Y27 |
|---|---|---|---|---|---|---|---|---|---|---|---|---|
| V | 1, 0, 0 | 1, 0, 0 | 1, 0, 0 | V | 0 | 0 | 0 | 0 | ... | 0 | 0 | 0 |
| V | 1, 0, 0 | 1, 0, 0 | 0, 1, 0 | 0 | V | 0 | 0 | 0 | ... | 0 | 0 | 0 |
| V | 1, 0, 0 | 0, 1, 0 | 0, 0, 1 | 0 | 0 | V | 0 | 0 | ... | 0 | 0 | 0 |
| V | 0, 1, 0 | 0, 1, 0 | 1, 0, 0 | 0 | 0 | 0 | V | 0 | ... | 0 | 0 | 0 |
| V | 0, 1, 0 | 0, 0, 1 | 0, 1, 0 | 0 | 0 | 0 | 0 | V | ... | 0 | 0 | 0 |
| V | 0, 1, 0 | 0, 0, 1 | 0, 0, 1 | 0 | 0 | 0 | 0 | 0 | ... | 0 | 0 | 0 |
| V | 0, 0, 1 | 1, 0, 0 | 1, 0, 0 | 0 | 0 | 0 | 0 | 0 | ... | 0 | 0 | 0 |
| V | 0, 0, 1 | 1, 0, 0 | 0, 1, 0 | 0 | 0 | 0 | 0 | 0 | ... | 0 | 0 | 0 |
| V | 0, 0, 1 | 0, 1, 0 | 0, 0, 1 | 0 | 0 | 0 | 0 | 0 | ... | 0 | 0 | 0 |
| V | 1, 0, 0 | 0, 1, 0 | 1, 0, 0 | 0 | 0 | 0 | 0 | 0 | ... | 0 | 0 | 0 |
| V | 1, 0, 0 | 0, 0, 1 | 0, 1, 0 | 0 | 0 | 0 | 0 | 0 | ... | 0 | 0 | 0 |
| V | 1, 0, 0 | 0, 0, 1 | 0, 0, 1 | 0 | 0 | 0 | 0 | 0 | ... | 0 | 0 | 0 |
| V | 0, 1, 0 | 1, 0, 0 | 1, 0, 0 | 0 | 0 | 0 | 0 | 0 | ... | 0 | 0 | 0 |
| V | 0, 1, 0 | 1, 0, 0 | 0, 1, 0 | 0 | 0 | 0 | 0 | 0 | ... | 0 | 0 | 0 |
| V | 0, 1, 0 | 0, 1, 0 | 0, 0, 1 | 0 | 0 | 0 | 0 | 0 | ... | 0 | 0 | 0 |
| V | 0, 0, 1 | 0, 1, 0 | 1, 0, 0 | 0 | 0 | 0 | 0 | 0 | ... | 0 | 0 | 0 |
| V | 0, 0, 1 | 0, 0, 1 | 0, 1, 0 | 0 | 0 | 0 | 0 | 0 | ... | 0 | 0 | 0 |
| V | 0, 0, 1 | 0, 0, 1 | 0, 0, 1 | 0 | 0 | 0 | 0 | 0 | ... | 0 | 0 | 0 |
| V | 1, 0, 0 | 1, 0, 0 | 1, 0, 0 | 0 | 0 | 0 | 0 | 0 | ... | 0 | 0 | 0 |
| . | . | . | . | . | . | . | . | . |  | . | . | . |
| . | . | . | . | . | . | . | . | . |  | . | . | . |
| . | . | . | . | . | . | . | . | . |  | . | . | . |
| V | 0, 0, 1 | 0, 1, 0 | 0, 0, 1 | 0 | 0 | 0 | 0 | 0 | ... | V | 0 | 0 |
| V | 0, 0, 1 | 0, 0, 1 | 0, 1, 0 | 0 | 0 | 0 | 0 | 0 | ... | 0 | V | 0 |
| V | 0, 0, 1 | 0, 0, 1 | 0, 0, 1 | 0 | 0 | 0 | 0 | 0 | ... | 0 | 0 | V |

The above mentioned 3D logic array structures 100, 200 and 300 and similar structures can be used in a 3D semiconductor device for reducing the number of the lines in a periphery line structure. Please referring to FIG. 5, a 3D semiconductor device 4000 is shown. The 3D semiconductor device 4000 includes an array structure 4300, a first periphery line structure 4100, a second periphery line structure 4200 and a 3D logic array structure 400. The array structure 4300 is used for trapping charge to store data. For example, the array structure 4300 may be a NOR flash array or a DRAM array. The first periphery line structure 4100 may be a word line structure. For example, the word line structure may include some decoders. The second periphery line structure 4200 may be a bit line structure. For example, the bit line structure may include some page buffers.

Figure 5:
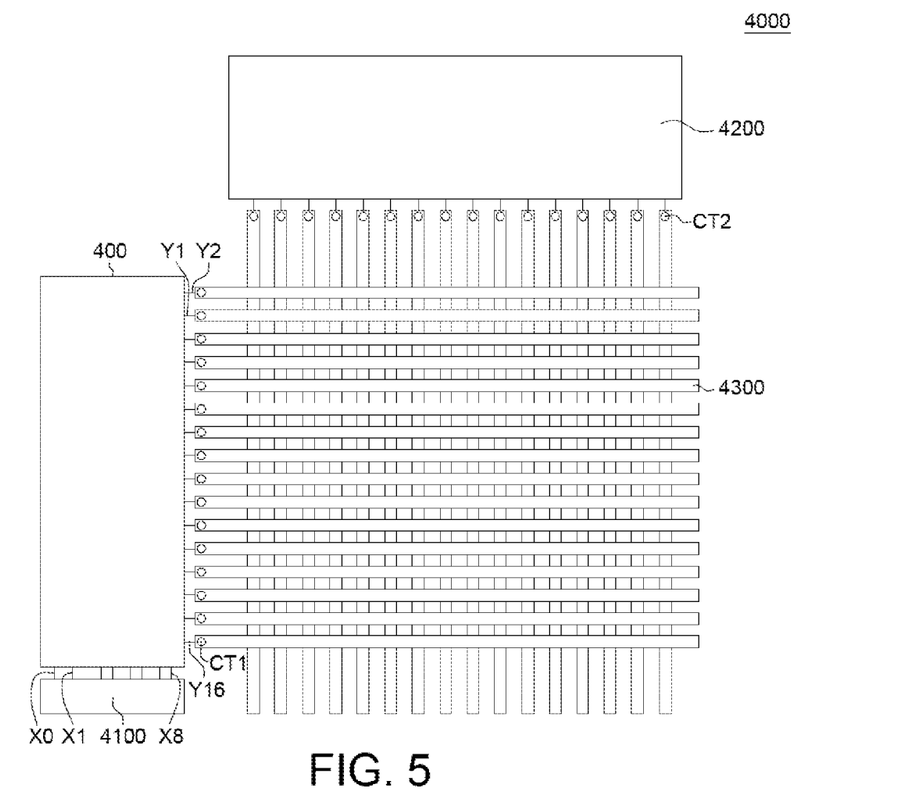
FIG. 5 shows a 3D semiconductor device.

The array structure 4300 has 16 first contacts CT1 located at a first side and 16 second contacts CT2 located at a second side. The array structure 4300 has 256 (=16*16) bits data. The 3D logic array structure 400 is similar to the 3D logic array structure 300 in FIG. 3, and the similarity will not repeated here. The 3D logic array structure 400 is disposed between the array structure 4300 and the first periphery line structure 4100 for reducing the number of the lines in the first periphery line structure 4100.

By using the 3D logic array structure 400, the number of the lines in the first periphery line structure 4100 is reduced from 16 to 9. Similarly, if the number of the first contacts CT1 is Y which is within $M^{N-1}$ to $M^N$, the 3D logic array structure 400 have N sets of gate electrodes, one input electrode and Y output electrodes, and each set of the gate electrodes has M gate electrodes, then the number of the lines in the first periphery line structure 4100 can be reduced from Y to M·N+1. As such, the manufacturing cost can be reduced.

Figure 6:
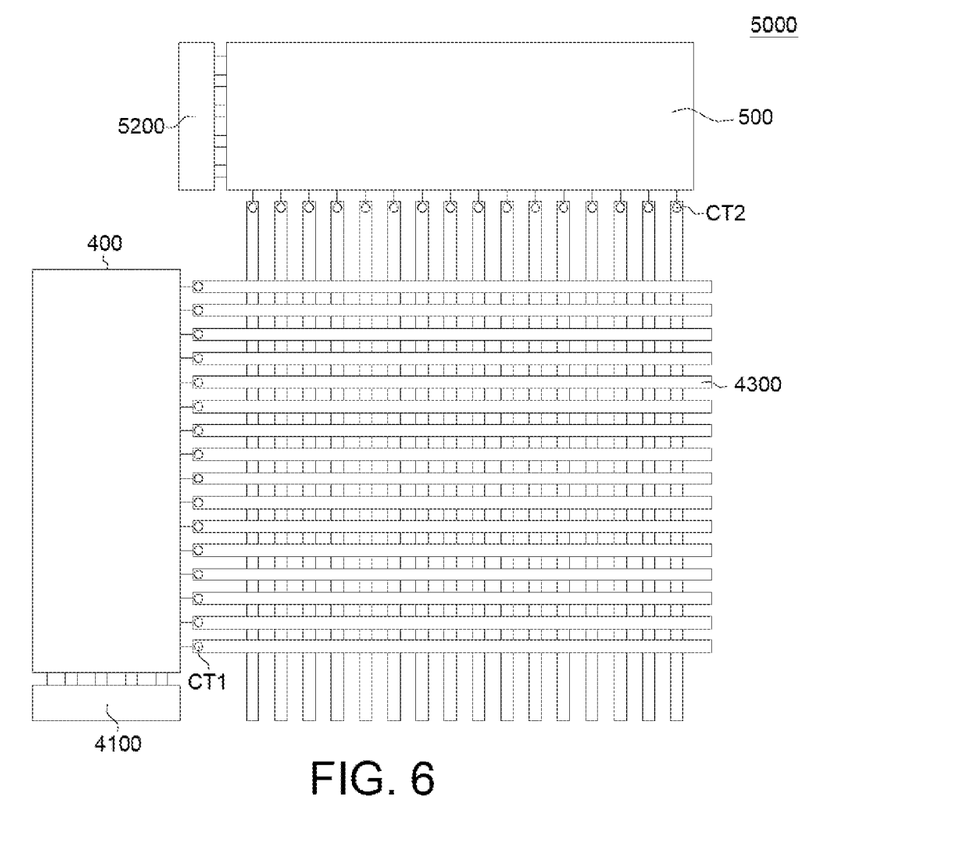
FIG. 6 shows another 3D semiconductor device.

Please referring to FIG. 6, another 3D semiconductor device 5000 is shown. In one embodiment, the 3D semiconductor device 5000 may further includes another 3D logic array structure 500. The 3D logic array structure 500 is disposed between the array structure 4300 and the second periphery line structure 5200 for reducing the number of the lines in the second periphery line structure 5200.

If the number of the second contacts CT2 is Z which is within $T^{S-1}$ to $T^S$, the 3D logic array structure 500 have S sets of gate electrodes, one input electrode and Z output electrodes, and each set of the gate electrodes has T gate electrodes, then the number of the lines in the second periphery line structure 5200 can be reduced from Z to T·S+1. As such, the manufacturing cost can be reduced.

Figure 7:
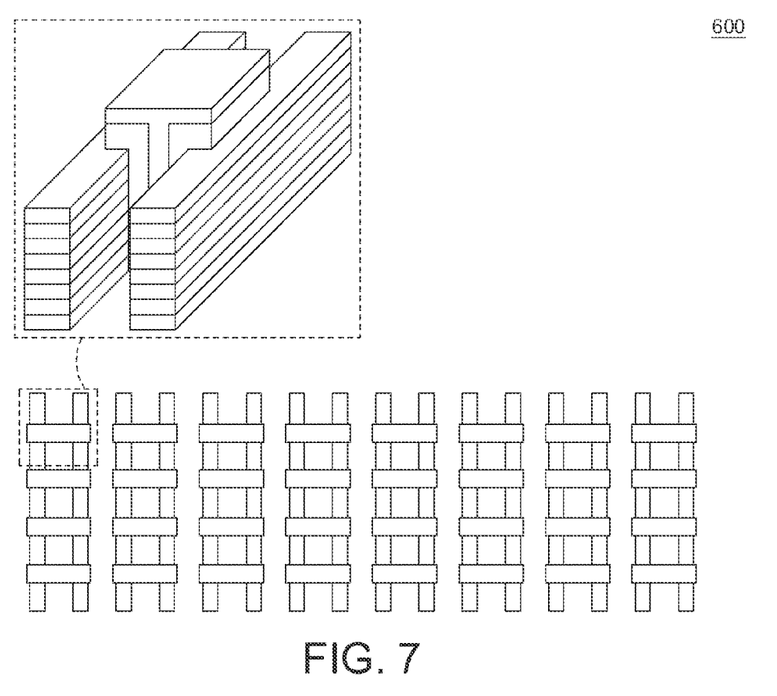
FIG. 7 shows a 3D logic array structure.

The 3D logic array structures 100, 200, 300, 400 and 500 mentioned above may be a double gate array structure or a single gate array structure. For example, please referring to FIGS. 1 and 2, the 3D logic array structures 100, 200 are exemplified as double gate array structures. Please referring to FIG. 7, a 3D logic array structure 600 is shown. For example, the 3D logic array structure 600 is exemplified as a single gate array structure.

Figure 8:
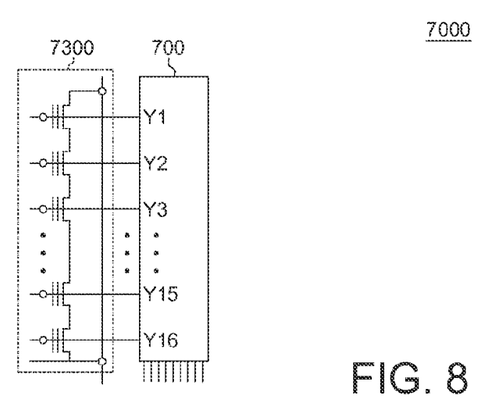
FIG. 8 shows another 3D semiconductor device.

Please referring to FIG. 8, another 3D semiconductor device 7000 is shown. In one embodiment, an array structure 7300 of the 3D semiconductor device 7000 may be a NAND string. A 3D logic array structure 700 can be used for controlling the array structure 7300 which is a NAND string. The 3D logic array structure 700 is similar to the 3D logic array structure 300 in FIG. 3, and the similarity will not repeated here. In the 3D logic array structure 300 in FIG. 3, the logical values of two of each set of the gate electrodes X1 to X8 are reverse. In the 3D logic array structure 700 in FIG. 8, the logical values of two of each set of the gate electrodes X1 to X8 are not always reverse. For example, all of the gate electrodes X1 to X8 can be applied a suitable voltage to apply all of the output electrodes Y1 to Y16 a pass voltage which is inputted from the input electrode X0. Then, one selected NAND can be applied a read voltage or a program voltage by applying a suitable voltage on four of the gate electrodes X1 to X8.

Figure 9:
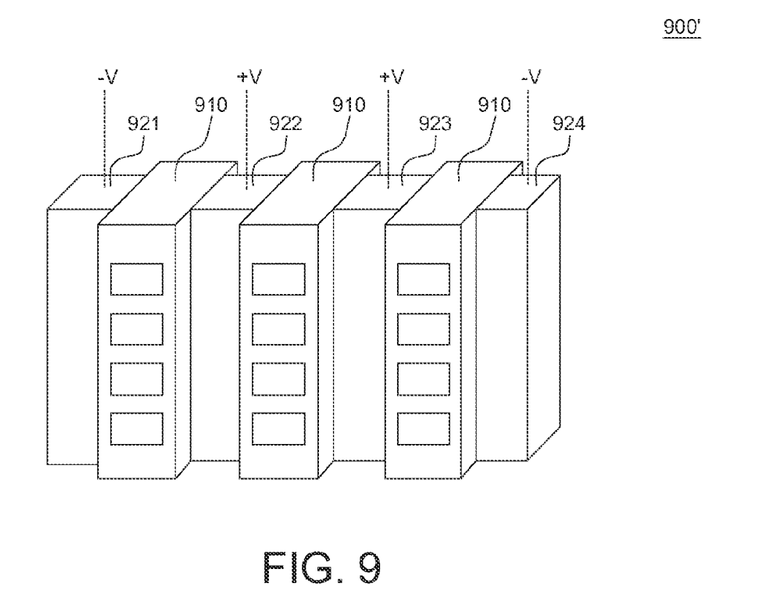
FIG. 9 shows another 3D logic array structure.

Please referring to FIG. 9, another 3D logic array structure 900' is shown. In one embodiment, the 3D logic array structure 900' may use double gate structures. The 3D logic array structure 900' includes three semiconductor stacks 910 and four gates 921, 922, 923 and 924. Each semiconductor stack 910 is disposed between two of the gates 921, 922, 923, 924. While the gates 922, 923 are applied a suitable positive voltage "+V" and the gates 921, 922 are applied a negative voltage "−V;" a channel will be formed in the semiconductor stack 910 located between the gate 922 and 923.

Figure 10:
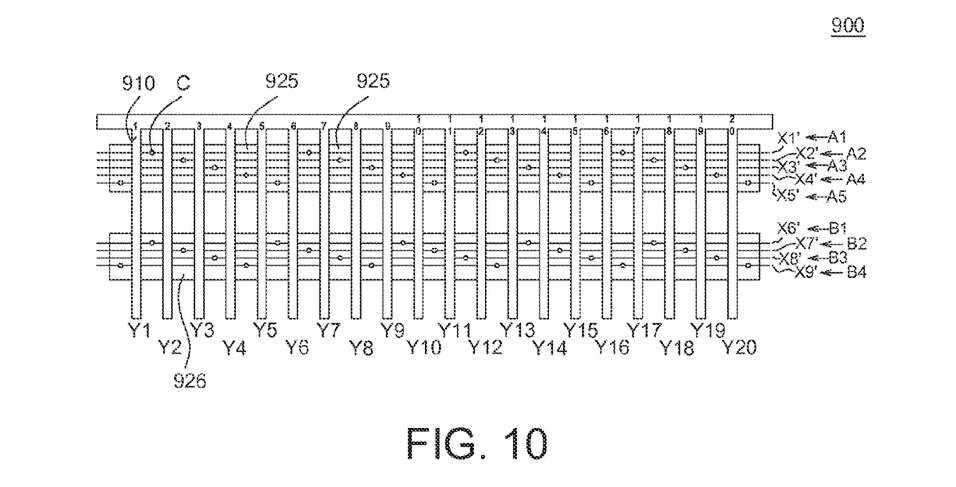
FIG. 10 shows another 3D logic array structure.

Please referring to FIG. 10, another 3D logic array structure 900 is shown. The 3D logic array structure 900 includes 5 first gate electrodes X1' to X5', 21 first gates 925, 4 second gate electrodes X6' to X9', 21 second gates 926 and 20 semiconductor stacks Y1 to Y20. Each first gate 925 is connected to one of the first gate electrodes X1' to X5' in turn. For example, the connecting sequence of the 21 first gates 925 is "X5', X1', X2', X3', X4', X5', X1', X2', X3', X4', X5', X1', X2', X3', X4', X5', X1', X2', X3', X4', X5'."

Each second gate 926 is connected to one of the second gate electrodes X6' to X9' to in turn. For example, the connecting sequence of the 21 second gates 926 is "X9', X6', X7', X8', X9', X6', X7', X8', X9', X6', X7', X8', X9'."

Each semiconductor stack 910 is located between two of the first gates 925 and two of the second gates 926. While the two first gates 925 and the two second gates 926 adjacent to one semiconductor stack 910 are applied a suitable positive voltage "+V," a channel will be formed in this semiconductor stack 910.

Each first gate electrode X1' to X5' is applied a positive voltage "+V", a negative voltage "−V" or a ground voltage "0," and each second gate electrode X6' to X9' is applied the positive voltage "+V", the negative voltage "−V" or the ground voltage "0." Please refer to a table VI, shown as below. If the logic value A1 is "1", then the first gate electrode X1' is applied the positive voltage "+V"; if the logic value A1 is "−1", then the first gate electrode X1' is applied the negative voltage "−V"; if the logic value A1 is "0", then the first gate electrode X1' is applied the ground voltage "0". Similarly, logic values A2, A3, A4 and A5 respectively represent that the first gate electrodes X2' to X5' are applied the positive voltage "+V," the negative voltage "−V" or the ground voltage "0." Logic values B1, B2, B3 and B4 respectively represent that the second gate electrodes X6' to X9' are applied the positive voltage "+V," the negative voltage "−V" or the ground voltage "0."

The 5 first gate electrodes X1' to X5' are applied "+V, −V, 0, −V, +V" respectively, or "+V, +V, −V, 0, −V" respectively, or "−V, +V, +V, −V, 0" respectively, "0, −V, +V, +V, −V" respectively, or "−V, 0, −V, +V, +V" respectively. The 4 second gate electrodes X6' to X9' are applied "+V, −V, −V, +V" respectively, or "+V, +V, −V, −V" respectively, or "−V, +V, +V, −V" respectively, or "−V, +V, +V, −V" respectively.

When the first gate electrodes X1' to X5' are applied "−V, +V, +V, −V, 0," i.e. the logic values A1 to A5 are "−1, 1, 1, −1, 0," and the second gate electrodes X6' to X9' are applied "−V, +V, +V, −V," i.e. the logic values B1 to B4 are "−1, 1, 1, −1," then a channel can be formed in the semiconductor stack Y3.

Similarly, when the first gate electrodes X1' to X5' are applied "+V, +V, −V, 0, −V," i.e. the logic values A1 to A5 are "1, 1, −1, 0, −1," and the second gate electrodes X6' to X9' are applied "−V, +V, +V, −V," i.e. the logic values B1 to B4 are "−1, 1, 1, −1," then a channel can be formed in the semiconductor stack Y7.

TABLE VI

| | Y1 | Y2 | Y3 | Y4 | Y5 | Y6 | Y7 | Y8 | Y9 | Y10 | Y11 | Y12 | Y13 | Y14 | Y15 | Y16 | Y17 | Y18 | Y19 | Y20 |
|---|---|---|---|---|---|---|---|---|---|---|---|---|---|---|---|---|---|---|---|---|
| A1 | 1 | 1 | −1 | 0 | −1 | 1 | 1 | −1 | 0 | −1 | 1 | 1 | −1 | 0 | −1 | 1 | 1 | −1 | 0 | −1 |
| A2 | −1 | 1 | 1 | −1 | 0 | −1 | 1 | 1 | −1 | 0 | −1 | 1 | 1 | −1 | 0 | −1 | 1 | 1 | −1 | 0 |
| A3 | 0 | −1 | 1 | 1 | −1 | 0 | −1 | 1 | 1 | −1 | 0 | −1 | 1 | 1 | −1 | 0 | −1 | 1 | 1 | −1 |
| A4 | −1 | 0 | −1 | 1 | 1 | −1 | 0 | −1 | 1 | 1 | −1 | 0 | −1 | 1 | 1 | −1 | 0 | −1 | 1 | 1 |
| A5 | 1 | −1 | 0 | −1 | 1 | 1 | −1 | 0 | −1 | 1 | 1 | −1 | 0 | −1 | 1 | 1 | −1 | 0 | −1 | 1 |
| B1 | 1 | 1 | −1 | −1 | 1 | 1 | −1 | −1 | 1 | 1 | −1 | −1 | 1 | 1 | −1 | −1 | 1 | 1 | −1 | −1 |
| B2 | −1 | 1 | 1 | −1 | −1 | 1 | 1 | −1 | −1 | 1 | 1 | −1 | −1 | 1 | 1 | −1 | −1 | 1 | 1 | −1 |
| B3 | −1 | −1 | 1 | 1 | −1 | −1 | 1 | 1 | −1 | −1 | 1 | 1 | −1 | −1 | 1 | 1 | −1 | −1 | 1 | 1 |
| B4 | 1 | −1 | −1 | 1 | 1 | −1 | −1 | 1 | 1 | −1 | −1 | 1 | 1 | −1 | −1 | 1 | 1 | −1 | −1 | 1 |

In one embodiment, the number of the first gates 925 is equal to that of the second gates 926. The number of the first gate electrodes can be M, the number of the second gate electrodes can be N, and the number of the output electrodes can be Y. The number of the first gates 925 is equal to or smaller than M*N+1. Y is equal to or smaller than M*N. M and N are natural numbers. M and N are larger or equal to 4, and the greatest common divisor of M and N is 1.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A 3D logic array structure, comprising:
   N sets of gate electrodes, wherein each set of the gate electrodes has M gate electrodes;
   an input electrode; and
   Y output electrodes, wherein the Y output electrodes connect Y contacts of an array structure, the Y contacts are located at a side of the array structure, the M·N gate electrodes and the input electrode connect a periphery line structure, Y is within $M^{N-1}$ to $M^N$, Y, M and N are natural numbers, and M is larger or equal to 2.

2. The 3D logic array structure according to claim 1, wherein M is 2 and the logic values of two of each set of the gate electrodes are reverse.

3. The 3D logic array structure according to claim 1, wherein M is larger than 2 and the logic values of M of each set of the gate electrodes are exclusive.

4. The 3D logic array structure according to claim 1, wherein each output electrode connects one of each set of the gate electrodes.

5. The 3D logic array structure according to claim 1, wherein the 3D logic array structure is a TFT AND gate array structure.

6. The 3D logic array structure according to claim 1, wherein the 3D logic array structure is a double gate array structure.

7. The 3D logic array structure according to claim 1, wherein the 3D logic array structure is a single gate array structure.

* * * * *